US011199434B2

(12) United States Patent
Huang et al.

(10) Patent No.: US 11,199,434 B2
(45) Date of Patent: Dec. 14, 2021

(54) DUAL POLARITY MUTUAL CAPACITIVE LIQUID SENSING

(71) Applicant: Microchip Technology Incorporated, Chandler, AZ (US)

(72) Inventors: Eric Huang, Fujian (CN); Xiang Gao, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 16/799,897

(22) Filed: Feb. 25, 2020

(65) Prior Publication Data
US 2020/0333175 A1    Oct. 22, 2020

(30) Foreign Application Priority Data

Apr. 22, 2019   (CN) .......................... 201910322862.9

(51) Int. Cl.
*G01F 23/26* (2006.01)
*G01R 27/26* (2006.01)

(52) U.S. Cl.
CPC .......... *G01F 23/265* (2013.01); *G01F 23/268* (2013.01); *G01R 27/2605* (2013.01)

(58) Field of Classification Search
CPC .... G01F 23/263; G01F 23/265; G01F 23/266; G01F 23/268; G01R 27/2605; G01R 27/2635

See application file for complete search history.

(56) References Cited

U.S. PATENT DOCUMENTS

| 5,802,728 | A | 9/1998 | Kamick et al. ............. 33/366.18 |
| 6,497,144 | B1 | 12/2002 | Lin .............................. 73/304 C |
| 2008/0231290 | A1* | 9/2008 | Zhitomirsky ......... G01F 23/265 324/661 |
| 2016/0047683 | A1 | 2/2016 | Winkens et al. ............. 73/304 C |

FOREIGN PATENT DOCUMENTS

WO    2006/123141 A2    11/2006

OTHER PUBLICATIONS

International Search Report and Written Opinion, Application No. PCT/US2020/024575, 12 pages, dated Jun. 19, 2020.

* cited by examiner

*Primary Examiner* — Justin N Olamit
(74) *Attorney, Agent, or Firm* — Slayden Grubert Beard PLLC

(57) ABSTRACT

A level sensing controller includes a signal generator circuit to generate an excitation signal. The controller also includes a connection to route an inverse of the excitation signal to a first polar electrode of a first capacitor. The first polar electrode is coupled to a container to hold liquid. The controller also includes a connection to route the excitation signal to a second polar electrode of a second capacitor. The second positive polar electrode is coupled to the container. The controller also includes a connection to a sense electrode to form the first capacitor with the first polar electrode and to form the second capacitor with the second polar electrode. The controller also includes a measurement circuit configured to measure charge at sensing electrode and determine, based on the measured charge, whether a liquid in the container has reached a level of the second polar electrode.

18 Claims, 4 Drawing Sheets

DUAL POLARITY MUTUAL CAPACITIVE LIQUID SENSING

FIELD OF THE INVENTION

The present disclosure relates to liquid level sensing and, more particularly, to dual-polarity, mutually capacitive liquid sensing.

BACKGROUND

Various techniques exist for the sensing of a level of liquid in a container. Liquid is sensed using contact or mechanical sensors, optical sensors for viewing levels, inductive sensors that measure electromagnetic induction generated by the liquid, hall effect sensors that measure a magnetic field generated by the liquid, and capacitance sensors.

The capacitance sensors used to measure liquid level include self-capacitance sensors and single polarity mutual capacitance sensors. However, inventors of embodiments of the present disclosure have discovered that these capacitive sensors drift with environmental conditions such as humidity or temperature. Thus, a triggering may be caused by liquid level change or environmental change. These capacitive sensors require referencing a reference value when water is not covering a sensing area and require calibration. Moreover, these capacitive sensors cannot tell the initial state of the sensor, and thus may assume that it is not triggered upon startup. Embodiments of the present disclosure address these shortcomings of other solutions discovered by inventors of these embodiments.

SUMMARY

Embodiments of the present disclosure include a level sensing controller. The controller may include a signal generator circuit configured to generate an excitation signal. The controller may include a first connection configured to route an inverse of the excitation signal to a first polar electrode of a first capacitor, the first polar electrode coupled to a container configured to hold liquid. The controller may include a second connection configured to route the excitation signal to a second polar electrode of a second capacitor, the second positive polar electrode coupled to the container. The controller may include a third connection to a sense electrode. The sense electrode may be configured to form the first capacitor with the first polar electrode and to form the second capacitor with the second polar electrode. The controller may include a measurement circuit configured to measure charge at the third connection and determine, based on the measured charge, whether a liquid in the container has reached a level of the second polar electrode. A polarity of the first polar electrode may be opposite a polarity of the second polar electrode.

Embodiments of the present disclosure may include a method of sensing a level. The method may include generating an excitation signal. The method may include, at a first connection, routing an inverse of the excitation signal to a first polar electrode of a first capacitor, the first polar electrode coupled to a container configured to hold liquid. The method may include, at a second connection, routing the excitation signal to a second polar electrode of a second capacitor, the second positive polar electrode coupled to the container. The method may include, at a third connection to a sense electrode, forming the first capacitor with the first polar electrode and the sense electrode. The method may include forming the second capacitor with the second polar electrode and the sense electrode, measuring charge at the third connection, and determining, based on the measured charge, whether a liquid in the container has reached a level of the second polar electrode. A polarity of the first polar electrode is opposite a polarity of the second polar electrode.

DETAILED DESCRIPTION

Figure 1:
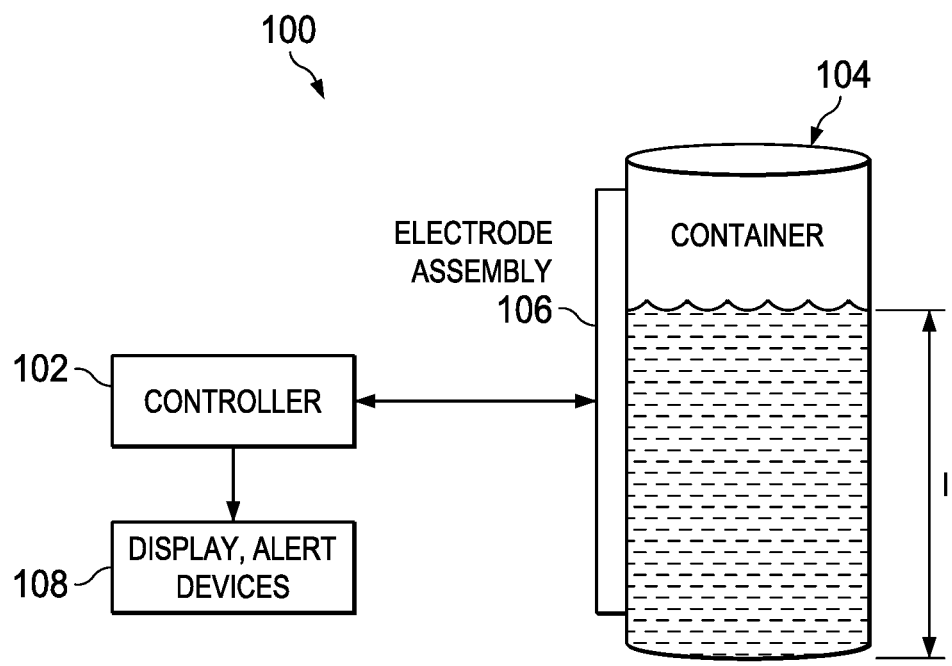
FIG. 1 is an illustration of an example system for dual-polarity, mutually capacitive liquid sensing, according to embodiments of the present disclosure.

Embodiments of the present disclosure may include a level sensing controller. The level sensing controller may include a signal generator circuit configured to generate an excitation signal. The signal generator circuit may be implemented by any suitable combination of analog circuitry, digital circuitry, or instructions for execution by a processor. The excitation signal may include a rising or falling edge of a voltage pulse. The signal generator circuit may include a first connection configured to route an inverse of the excitation signal to a first polar electrode of a first capacitor. The first polar electrode may be coupled to a container configured to hold liquid. The controller may include a second connection configured to route the excitation signal to a second polar electrode of a second capacitor. The second positive polar electrode may be coupled to the container. The controller may include a third connection to a sense electrode. The sense electrode may be configured to form the first capacitor with the first polar electrode and to form the second capacitor with the second polar electrode. The controller may include a measurement circuit configured to measure charge at the third connection and determine, based on the measured charge, whether a liquid in the container has reached a level of the second polar electrode. The connections may include any suitable electronic or electrical connection. The measurement circuit may be implemented by any suitable combination of analog circuitry, digital circuitry, or instructions for execution by a processor. A polarity of the first polar electrode may be opposite a polarity of the second polar electrode. For example, the first polar electrode may be positive and the second polar electrode may be negative. In another example, the first polar electrode may be negative and the second polar electrode may be positive. The electrodes may be located inside or outside of the container.

In combination with any of the above embodiments, the charge at the third connection may represent relative capacitance between the first capacitor and the second capacitor. In combination with any of the above embodiments, the measurement circuit is configured to determine that liquid in the container has reached the level of the first polar electrode based on a change in relative capacitance between the first capacitor and the second capacitor based on the charge at the third connection. In combination with any of the above embodiments, the controller further comprises a fourth connection to a third polar electrode of a third capacitor, the third polar electrode coupled to the container. The second connection may be further configured to route the excitation signal to the second polar electrode of the second capacitor when the liquid of the container is to be checked for proximity to the second polar electrode, and to route a ground signal to the second polar electrode of the second capacitor when the liquid of the container is to be checked for proximity to the third polar electrode. In combination with any of the above embodiments, the fourth connection is configured to route the excitation signal to the third polar electrode of the third capacitor when the liquid of the container is to be checked for proximity to the third polar electrode, and route a ground signal to the third polar electrode of the third capacitor when the liquid of the container is to be checked for proximity to the second polar electrode. In combination with any of the above embodiments, the sense electrode is further configured to form the third capacitor with the third polar electrode. In combination with any of the above embodiments, the first polar electrode may be coupled to the container outside of a possible range of the liquid. In combination with any of the above embodiments, the excitation signal as applied to the second capacitor may be configured to cause detection of the level of the liquid in the container. In combination with any of the above embodiments, the inverse of the excitation signal as applied to the first capacitor may be configured to cause compensation for capacitance changes in the second capacitor due to environmental changes.

Embodiments of the present disclosure may include a system. The system may include any of the level sensing controllers described above. The system may include an electrode assembly. The electrode assembly may include the sense electrode and the polar electrodes described above.

Embodiments of the present disclosure may include a method for determining a level. The method may include operation of any of the controllers and systems discussed above.

FIG. 1 is an illustration of an example system 100 for dual-polarity, mutually capacitive liquid sensing, according to embodiments of the present disclosure. System 100 may be used to sense a level of liquid in any suitable application, such as in consumer devices, storage tanks, automotive applications, reservoirs, water, waste water, utilities, or oil and gas. System 100 may be configured to determine a level l of liquid in any suitable container 104. Although container 104 is illustrated as a cylinder, any suitably shaped, arranged, or oriented container may be used. The level l of liquid may be defined in reference to any suitable other part of container 104, such as a bottom of container 104. System 100 may be configured to take a measurement of 1 periodically, on-demand, or upon any suitable stimulus or criteria. System 100 may be configured to report the measurement of 1, or generate an alert of 1 reaching an upper threshold or lower threshold, periodically, on-demand, or upon any suitable stimulus or criteria.

System 100 may include a controller 102. Controller 102 is shown in further detail in FIG. 3, discussed in more detail further below. Controller 102 may be implemented by digital circuitry, analog circuitry, instructions for execution by a processor, or any suitable combination thereof consistent with the teachings of the present disclosure. In one embodiment, controller 102 may include interfaces for, or portions of, multiple dual-polarity, mutually capacitive sensors. Controller 102 may include signal generation circuitry to be applied to the dual-polarity, mutually capacitive sensors. Furthermore, controller 102 may include circuitry to integrate signals received from the dual-polarity, mutually capacitive sensors.

System 100 may include an electrode assembly 106 coupled to container 104. Electrode assembly 106 may be coupled to container 104 on the outside or on the inside of container 104. Electrode assembly 106 is shown in further detail in FIG. 2, discussed in more detail further below. Electrode assembly 106 may include any suitable number and kind of electrodes. Such electrodes may be arranged in 1:1 or 1:N pairs with each other. Furthermore, such electrodes may form capacitors upon receipt of excitation signals. The excitation signals may be received from controller 102. The excitations signals may be routed to transmit and receive electrodes of electrode assembly 106. The excitation signals, when applied to a pair of electrodes, may facilitate measurement of charge between the electrodes. The measurement of charge between the electrodes may be used to measure the capacitance between the electrodes. The capacitance measurement may be used as a proximity evaluation for liquid in container 104. The position of the electrodes in relation to container 104 may be known, and thus the associated measurement of capacitance may be used to determine whether liquid has reached a given level l in container 104, wherein the position of an electrode making a proximity detection or change may denote that the liquid has reached the known position of the electrode.

Controller 102 may be configured to sequentially measure capacitance at electrode pairs of electrode assembly 106 in container 104 and report proximity of liquid in any suitable manner. Controller 102 may start, for example, from electrode pairs at a top of electrode assembly 106 and work towards electrode pairs at a bottom of electrode assembly 106. In one embodiment, controller 102 may evaluate the capacitance between all electrode pairs of electrode assembly 106. Controller 102 may then report the capacitance of each such electrode pair to, for example, display or alert device 108. Controller 102 may report whether each such electrode pair has detected proximity of liquid to the electrode pair. Controller 102 may report the given level l associated with the highest electrode pair that detected proximity to liquid. In another embodiment, upon determining proximity of liquid in container 104 while evaluating electrode pairs from top to bottom, controller 102 may report such a detection and the level l of the electrode pair making such a detection.

Figure 2:
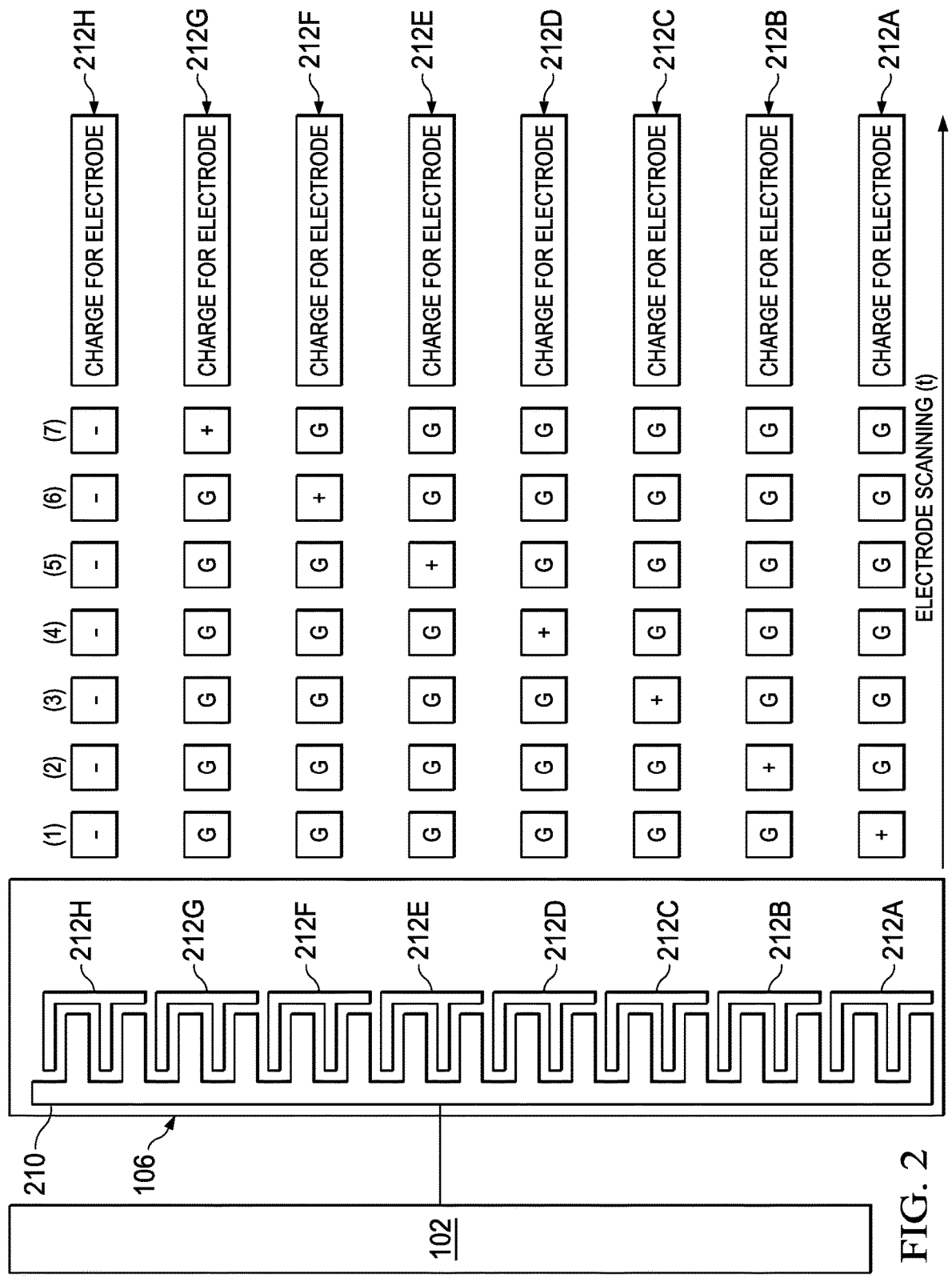
FIG. 2 is more detailed illustration of an electrode assembly for dual-polarity, mutually capacitive liquid sensing, according to embodiments of the present disclosure.

FIG. 2 is more detailed illustration of electrode assembly 106 for dual-polarity, mutually capacitive liquid sensing, according to embodiments of the present disclosure. Furthermore, FIG. 2 illustrates charge applied to various electrodes of electrode assembly 106 over time in order to scan for capacitance values and thus proximity of liquid for electrodes.

Electrode assembly 106 may include sensing electrode 210. Sensing electrode 210 may be used to connect to a collection or sensing node of controller 102 during polling of electrodes in electrode assembly 106. Sensing electrode 210 may be a first electrode of multiple pairs of electrodes that are formed for proximity detection. Sensing electrode 210 may include a high input impedance. When connecting to sensing electrode 210, controller 102 may pre-charge sensing electrode 210 to half of the supply voltage. During subsequent measurements, the voltage of sensing electrode 210 may float.

Electrode assembly 106 may include two or more second electrodes or polar electrodes 212A-212H. Each of polar electrodes 212A-212G may be used to connect to a positive signal from controller 102 during polling of the given polar electrode, and to connect to ground during polling of other ones of polar electrodes 212A-212G. Polar electrode 212H may be used to connect to a negative signal from controller 102 during polling of polar electrodes 212A-212G.

Polar electrodes 212A-212H may be configured to operate as transmit electrodes for a capacitive sensor. Sensing electrode 210 may be configured to operate as a receiving electrode for a capacitive sensor. Thus, each pair of electrodes including sensing electrode 210 and one of polar electrodes 212A-212H may be a capacitive sensor and represented as a capacitor.

In the example of FIG. 2, electrode assembly 106 may be arranged vertically along the side of container 104. Thus, polar electrodes 212A-212G may be arranged vertically from bottom to top within electrode assembly 106. Polar electrode 212H may be arranged at the top of electrode assembly 106. Each of polar electrodes 212A-212G may be configured to indicate whether liquid in container 104 has reached the vertical position associated with the given one of polar electrodes 212A-212G. From the detection or proximity sensing provided by the given one of electrodes 212A-212G and the known position or height of electrodes 212A-212G, system 100 may be able to determine a level 1 of liquid in container 104.

When sensing electrode 210 is connected to a collection node of controller 102, polar electrode 212H is connected to a negative signal, and a given one of polar electrodes 212A-212G are connected to a positive signal, a first capacitive sensor may be formed between polar electrode 212H and sensing electrode 210, and a second capacitive sensor may be formed between sensing electrode 210 and the given one of polar electrodes 212A-212G. The capacitive sensors may be configured to detect proximity to liquid in container 104.

To scan the electrode combinations for proximity to liquid in container 104, at (1) sensing electrode 210 may be connected to a collection node of controller 102, a negative signal or pulse may be applied to polar electrode 212H, ground may be applied to polar electrodes 212B-212G, and a positive signal or pulse may be applied to polar electrode 212A. If liquid in container 104 is at the height of polar electrode 212A, then capacitive sensors formed by the combination of polar electrode 212H, polar electrode 212A, and sensing electrode 210 may indicate, to system 100, a proximity of liquid to polar electrode 212A.

At (2), sensing electrode 210 may be connected to a collection node of controller 102, a negative signal or pulse may be applied to polar electrode 212H, ground may be applied to polar electrodes 212A and 212C-212G, and a positive signal or pulse may be applied to polar electrode 212B. If liquid in container 104 is at the height of polar electrode 212B, then capacitive sensors formed by the combination of polar electrode 212H, polar electrode 212B, and sensing electrode 210 may indicate, to system 100, a proximity of liquid to polar electrode 212B.

At (3)-(7), this same polling may be performed for polar electrodes 212C-212G.

While FIG. 2 is described as applying a negative signal to polar electrode 212H, a positive signal to a respective one of polar electrodes 212A-212G, and connecting sensing electrode 210 to a collection node of controller 102, any suitable signals and voltages may be applied so as to create capacitive sensors between polar electrode 212H and sensing electrode 210 and between sensing electrode 210 and the given one of polar electrodes 212A-212G. In one embodiment, a negative signal may be applied to given ones of polar electrodes 212A-212G and a positive signal may be applied to polar electrode 212H. Any voltage values for the negative signal and the positive signal may be used as long as a falling edge is applied to polar electrode 212H while a rising edge is applied to a respective one of polar electrodes 212A-212G, or as long as a rising edge is applied to polar electrode 212H while a falling edge is applied to a respective one of polar electrodes 212A-212G. The rising and falling edges may be of approximately the same absolute magnitude and change rate.

Figure 3:
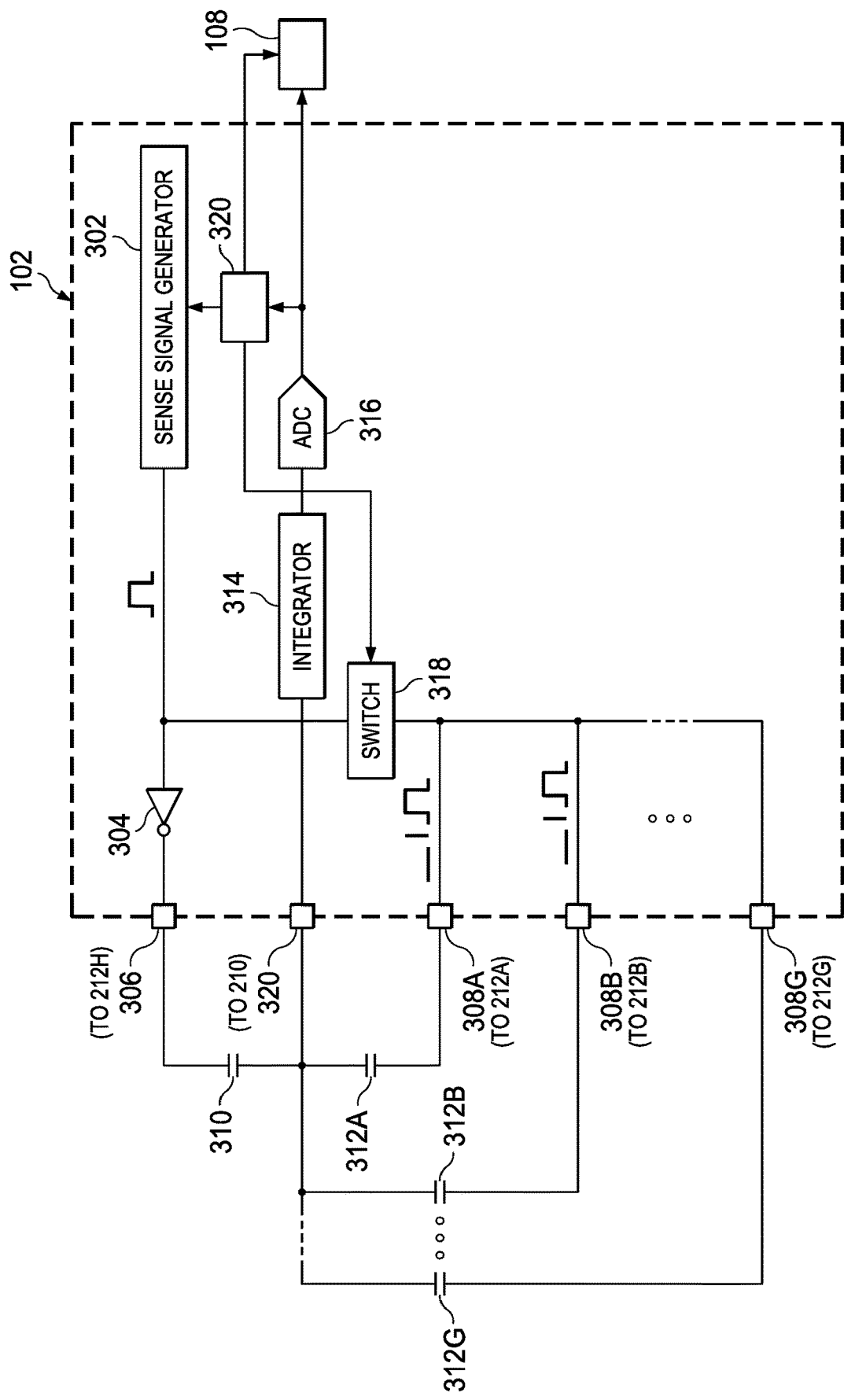
FIG. 3 is more detailed illustration of a controller for dual-polarity, mutually capacitive liquid sensing, according to embodiments of the present disclosure.

FIG. 3 is more detailed illustration of controller 102 for dual-polarity, mutually capacitive liquid sensing, according to embodiments of the present disclosure. Furthermore, FIG. 3 illustrates portions of electrode array 106 that have formed capacitive sensors.

Controller 102 may include a terminal 306 for connection to polar electrode 212H of electrode assembly 106. Furthermore, controller 102 may include a terminal 320 for connection to sensing electrode 210 of electrode assembly 106. In addition, controller 102 may include terminals 308A-308G for connections to each of polar electrodes 212A-212G.

Connections between controller 102, sensing electrode 210, and polar electrodes 212A-212H may form capacitive sensors in electrode assembly 106, represented in FIG. 3 by capacitors 310, 312A-312G. Connections from terminal 306 to polar electrode 212H and from terminal 320 to sensing electrode 210 may form capacitor 310.

Connections from terminal 308A to polar electrode 212A and from terminal 320 to sensing electrode 210 may form capacitor 312A. Connections from terminal 308B to polar electrode 212B and from terminal 320 to sensing electrode 210 may form capacitor 312B. Similarly, connections from terminals 308C-308G to polar electrodes 212C-212G and from terminal 320 to sensing electrode 210 may form capacitors 312C-312G (terminals 308C-308F, capacitors 312C-312F and associated connections and branches not shown).

Controller 102 may include a sense signal generator 302. Sense signal generator 302 may be configured to generate a pulse signal, an excitation signal, transmission signal, or any other suitable signal for a transmitting electrode of a capacitive sensor. Sense signal generator 302 may be implemented by analog circuitry, digital circuitry, instructions for execution by a processor, or any suitable combination thereof. In the example of FIG. 3, sense signal generator 302 may be configured to generate a positive pulse signal when controller 102 is evaluating the capacitance of a given capacitive sensor.

The positive pulse signal generated by sense signal generator 302 may be routed to an inverter 304, and the resulting negative pulse signal may be routed to terminal 306, to be applied to polar electrode 212H. The positive pulse signal generated by sense signal generator 302 may be further routed to a switch 318, which may in turn route the positive pulse signal to a selected one of terminals 308A-308G, to be applied to a selected one of polar electrodes 212A-212G.

Switch 318 may be implemented in any suitable manner, such as a multiplexer, switch fabric, switch matrix, or other suitable structure. Switch 318 may be configured to issue the positive pulse signal to a selected one of terminals 308A-308G, and a ground signal to the others of terminals 308A-308G.

Controller 102 may include a control circuit 320. Control circuit 320 may be implemented in any suitable manner, such as analog circuitry, digital circuitry, instructions for execution by a processor and the processor, or any suitable combination thereof. For example, control circuit 320 may be implemented by digital logic, an application-specific integrated circuit, a field programmable gate array, a processor, or a microcontroller. Control circuit 320 may be configured to control the operation, timing, polling, and gathering of results from sensors of system 100. For example, control circuit 320 may be configured to specify to sense signal generator 302 when to generate pulses to perform measurements in electrode assembly 106. Furthermore, control circuit 320 may be configured to specify to switch 318 which terminals are to receive the pulses and which terminals are to receive the ground signal. Thus, control circuit 320 may specify which of electrodes 212A-212G are to perform a proximity detection of liquid in container 104 at a given moment in time. Furthermore, control circuit 320 may be configured to gather results of measurements, store the results in memory, or report these results to other entities 108.

The capacitances of capacitor 310 and capacitors 312A-312H may vary according to whether a given one of such capacitors is in close proximity to liquid in container 104. In one embodiment, polar electrode 212H may be kept out of the range of liquid in container 104. Accordingly, the capacitance of capacitor 310 may be unaffected by the level 1 of liquid in container 104. Thus, the capacitance of capacitor 310 may be kept constant across all levels of liquid in container 104. However, the capacitance of capacitor 310 may vary according to different environmental conditions in which system 100 is used, such as temperature, humidity, or electromagnetic interference. If a given one of polar electrodes 212A-212G is proximate to liquid in container 104, the capacitance between the given polar electrode and sensing electrode 210 will change, and thus the capacitance of the associated one of capacitors 312A-312G. However, the capacitance of capacitors 312A-312G may also vary according to different environmental conditions in which system 100 is used, such as temperature, humidity, or electromagnetic interference.

Controller 102 may be configured to determine whether the capacitance of one or more of capacitors 312A-312G has changed, indicating proximity of respective ones of polar electrodes 212A-212G to liquid in container 104. Controller 102 may poll or evaluate each or one of more of capacitors 312A-312G in turn. Controller 102 may be configured to evaluate the capacitance of the given one of capacitors 312A-312G and compare the capacitance of the given one of capacitors 312A-312G to the capacitance of capacitor 310. Controller 102 may be configured to compare the capacitance of one of capacitors 312A-312G with the capacitance of capacitor 310 by, for example, evaluating the charge at a point between the given one of capacitors 312A-312G and capacitor 310.

When a given one of capacitors 312A-312G is selected for evaluation by applying a positive signal to the respective one of terminals 308A-308G, ground may be applied to the other ones of terminals 308A-308G, and a negative signal may be applied to terminal 306. Taking capacitor 312A as an example, the top plate (electrode 212H) of capacitor 310 has the negative voltage, the bottom plate (electrode 210) of capacitor 310 is at the same voltage as the top plate (electrode 210) of capacitor 312A, and the bottom plate (electrode 212A) capacitor 312A has the positive voltage. Based upon the capacitances of capacitor 312A and 310, differing amounts of charge will accumulate on the bottom plate of capacitor 310 and the top plate of capacitor 312A. If the capacitances of capacitor 312A and capacitor 310 are the same, a certain amount of charge will accumulate. Such a condition may occur wherein electrode 212A of capacitor 312A is not adjacent to liquid in container 104.

The parasitic capacitance of capacitor 312A may drift due to changes in humidity, temperature, electromagnetic interference, or other environmental conditions. This change in capacitance is slow, but this change in capacitance cannot be distinguished from changes in capacitance due to liquid in container 104 on the basis of the rate of change, as changes in capacitance due to liquid in container 104 might also be slow. In one embodiment, inclusion of capacitor 310 may account for such slow, environmental changes in capacitance of capacitor 312A, as these two capacitors, being implemented in a common electrode assembly 106, on a same printed circuit board, or with duplicate materials, may have the same expected capacitance. Capacitor 310 and capacitor 312A may experience the same environmental change. Capacitor 310 may have an expected same charge, albeit of opposite polarity, as capacitor 312A, due to the applied signals from sense signal generator 302. Thus, capacitor 310 may provide compensation for capacitance changes experienced by capacitor 312A due to environmental changes.

Accordingly, if the capacitances of capacitor 312A and capacitor 310 are the same, a first amount of charge will accumulate between these capacitors, and this amount of charge may represent that electrode 212A is not adjacent to liquid in container 104. In one embodiment, if the capacitances of capacitor 312A and capacitor 310 are different, a second, different amount of charge will accumulate. Such a condition may occur when electrode 212A of capacitor 312A is adjacent to liquid in container 104. In such a condition, controller 102 may detect the second, different amount of charge and interpret this second amount of charge as an indication that liquid in container 104 has reached electrode 212A. Controller 102 may determine the second, different amount of charge and translate the amount of charge against thresholds indicating that liquid in container 104 has approached electrode 212A. In another embodiment, zero charge might accumulate between capacitors 310, 312A when the capacitances of these capacitors are the same, and a non-zero charge might accumulate between capacitors 310, 312A when the capacitances of these capacitors are different, i.e. the first amount of charge may be zero.

Controller 102 may include any suitable circuitry for evaluating the charge accumulated between capacitor 310 and capacitor 312A. For example, controller 102 may include a measurement circuit such as an integrator 314. Integrator 314 may be implemented by, for example, digital circuitry, analog circuitry, or any suitable combination thereof. Integrator 314 may be configured to determine the charge accumulated between capacitor 310 and capacitor 312A. Integrator 314 may output an analog signal indicating the charge accumulated. The analog signal may be routed to an analog to digital converter (ADC) 316. The value of the charge from ADC 316 may be provided to control circuit 320 or output to other entities such as display or alert device 108.

The example operation described above of controller 102 with respect to capacitor 312A may also be used for any of capacitors 312B-312G.

Figure 4:
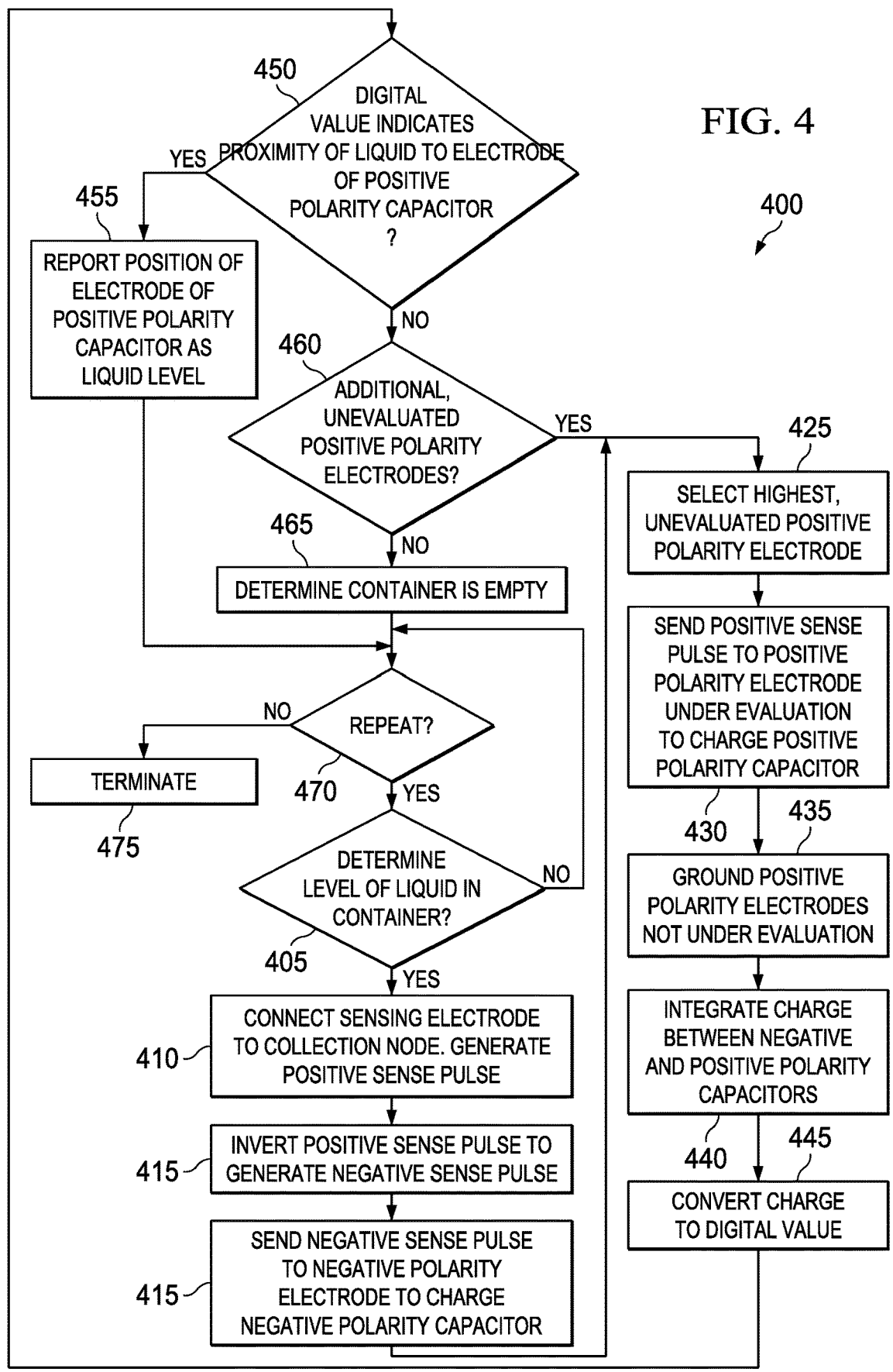
FIG. 4 is an illustration of a method for dual-polarity, mutually capacitive liquid sensing, according to embodiments of the present disclosure.

FIG. 4 is an illustration of a method 400 for dual-polarity, mutually capacitive liquid sensing, according to embodiments of the present disclosure. The steps of method 400 may be performed by, for example, any suitable portion of the elements of FIGS. 1-3, such as by controller 102. Method 400 may be initiated at any suitable point, such as at step 405. The steps of method 400 may be optionally repeated, omitted, or performed recursively. The steps of method 400 may be performed in the order discussed below, or in any other suitable, alternative order. Moreover, more or fewer steps may be performed during execution of method 400 compared to those shown in FIG. 4. Some portions of method 400 may be performed by instructions for a processor stored in a non-transitory machine-readable medium. The instructions, when loaded and executed by the processor, may cause the processor to perform the steps of method 400.

At step 405, it may be determined whether to find the level of liquid in a container. The determination of whether to find the level of liquid may be made, for example, on-demand from a larger appliance or system, periodically, or upon any other suitable criteria. If the level of liquid is to be found, method 400 may proceed to step 410. Otherwise, method 400 may proceed to step 470.

At step 410, a positive sense pulse may be generated. At step 415, the positive sense pulse may be inverted to generate a negative sense pulse. At step 420, the negative sense pulse may be sent to a negative polarity electrode in an electrode assembly adjacent to, or disposed within, the container. Sending the negative sense pulse to the negative polarity electrode may charge a negative polarity capacitor that will be formed by the negative polarity electrode and a sensing electrode. The sensing electrode may be connected to a collection node of a controller or other device performing method 400.

At step 425, a positive polarity electrode in the electrode assembly adjacent to, or disposed within, the container may be selected. In one embodiment, the positive polarity electrode that is the highest electrode that has not yet been evaluated may be selected.

At step 430, the positive sense pulse may be sent to the selected positive polarity electrode. Sending the positive sense pulse to the selected positive polarity electrode may charge a positive polarity capacitor that will be formed by the selective positive polarity electrode and the sensing electrode.

At step 435, other positive polarity electrodes in the electrode assembly adjacent to the container that are not presently selected for evaluation may be grounded, or otherwise isolated or prevented from affecting measurements associated with the positive polarity electrode selected for evaluation.

At step 440, charge between the negative and positive polarity capacitors may be collected or integrated. At step 445, the collected charge may be converted to a digital value. At step 450, the value of the collected charge may be evaluated to determine a capacitance value of the positive polarity capacitor compared to a capacitance value of the negative polarity capacitor. The relative value of the capacitances as shown by the value of the collected charge may illustrate whether a liquid has reached the selected positive polarity electrode of the positive polarity capacitor. If the value indicates a proximity of liquid to the selected positive polarity electrode, method 400 may proceed to step 455. Otherwise, method 400 may proceed to step 460.

At step 455, a report or other indicator may be generated for the selected positive polarity electrode or the position thereof, indicating that the liquid level of the container has reached the selected positive polarity electrode or the position thereof. Method 400 may proceed to step 470.

At step 460, it may be determined whether there are additional positive polarity electrodes that have not yet evaluated. If so, method 400 may proceed to step 425 wherein a next electrode may be selected for evaluation. Otherwise, method 400 may proceed to step 465.

At step 465, it may be determined that the container is empty. Method 400 may proceed to step 470.

At step 470, it may be determined whether method 400 may repeat. Method 400 may repeat continuously, on-demand, or upon other suitable criteria established or controlled by a system in which liquid level detection is performed. Method 400 may proceed to step 405 if method 400 is to repeat or may proceed to step 475 to terminate if method 400 is to not repeat.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

We claim:

1. A level sensing controller, comprising:
   a signal generator circuit configured to generate an excitation signal;
   a first connection configured to route an inverse of the excitation signal to a first polar electrode of a first capacitor, the first polar electrode coupled to a container configured to hold liquid;
   a second connection configured to route the excitation signal to a second polar electrode of a second capacitor, the second polar electrode coupled to the container;
   a third connection to a sense electrode, the sense electrode configured to form the first capacitor with the first polar electrode and to form the second capacitor with the second polar electrode; and
   a measurement circuit configured to measure charge at the third connection and determine, based on the measured charge, whether a liquid in the container has reached a level of the second polar electrode;
   wherein a polarity of the first polar electrode is opposite a polarity of the second polar electrode.

2. The level sensing controller of claim 1, wherein the charge at the third connection represents relative capacitance between the first capacitor and the second capacitor.

3. The level sensing controller of claim 1, wherein the measurement circuit is configured to determine that liquid in the container has reached the level of the second polar electrode based on a change in relative capacitance between the first capacitor and the second capacitor based on the charge at the third connection.

4. The level sensing controller of claim 1, further comprising a fourth connection to a third polar electrode of a third capacitor, the third polar electrode coupled to the container, wherein:
   the second connection is further configured to:
      route the excitation signal to the second polar electrode of the second capacitor when the liquid of the container is to be checked for proximity to the second polar electrode; and
      route a ground signal to the second polar electrode of the second capacitor when the liquid of the container is to be checked for proximity to the third polar electrode; and the fourth connection is configured to:
    route the excitation signal to the third polar electrode of the third capacitor when the liquid of the container is to be checked for proximity to the third polar electrode; and
    route a ground signal to the third polar electrode of the third capacitor when the liquid of the container is to be checked for proximity to the second polar electrode.

5. The level sensing controller of claim 4, wherein the sense electrode is further configured to form the third capacitor with the third polar electrode.

6. The level sensing controller of claim 4, wherein the first polar electrode is coupled to the container outside of a possible range of the liquid.

7. A method for sensing a level, comprising:
generating an excitation signal;
at a first connection, routing an inverse of the excitation signal to a first polar electrode of a first capacitor, the first polar electrode coupled to a container configured to hold liquid;
at a second connection, routing the excitation signal to a second polar electrode of a second capacitor, the second polar electrode coupled to the container;
at a third connection to a sense electrode, forming the first capacitor with the first polar electrode and the sense electrode;
forming the second capacitor with the second polar electrode and the sense electrode;
measuring charge at the third connection; and
determining, based on the measured charge, whether a liquid in the container has reached a level of the second polar electrode;
wherein a polarity of the first polar electrode is opposite a polarity of the second polar electrode.

8. The method of claim 7, wherein the charge at the third connection represents relative capacitance between the first capacitor and the second capacitor.

9. The method of claim 7, further comprising determining that liquid in the container has reached the level of the second polar electrode based on a change in relative capacitance between the first capacitor and the second capacitor based on the charge at the third connection.

10. The method of claim 9, further comprising:
through a fourth connection to a third polar electrode of a third capacitor, coupling the third polar electrode to the container;
through the second connection:
    routing the excitation signal to the second polar electrode of the second capacitor when the liquid of the container is to be checked for proximity to the second polar electrode; and
    routing a ground signal to the second polar electrode of the second capacitor when the liquid of the container is to be checked for proximity to the third polar electrode; and
through the fourth connection;
    routing the excitation signal to the third polar electrode of the third capacitor when the liquid of the container is to be checked for proximity to the third polar electrode; and
    routing a ground signal to the third polar electrode of the third capacitor when the liquid of the container is to be checked for proximity to the second polar electrode.

11. The method of claim 10, further comprising forming the third capacitor with the sense electrode and the third polar electrode.

12. The method of claim 10, further comprising providing the first polar electrode by coupling the first polar electrode to the container outside of a possible range of the liquid.

13. A system, comprising:
an electrode assembly, comprising a sensing electrode, a first polar electrode of a first capacitor, and a second polar electrode of a second capacitor, the electrode assembly coupled to a container configured to hold liquid;
a signal generator circuit configured to generate an excitation signal;
a first connection configured to route an inverse of the excitation signal to the first polar electrode of the first capacitor;
a second connection configured to route the excitation signal to the second polar electrode of the second capacitor;
a third connection to the sense electrode, the sense electrode configured to form the first capacitor with the first polar electrode and to form the second capacitor with the second polar electrode; and
a measurement circuit configured to measure charge at the third connection and determine, based on the measured charge, whether a liquid in the container has reached a level of the second polar electrode;
wherein a polarity of the first polar electrode is opposite a polarity of the second polar electrode.

14. The system of claim 13, wherein the charge at the third connection represents relative capacitance between the first capacitor and the second capacitor.

15. The system of claim 13, wherein the measurement circuit is configured to determine that liquid in the container has reached the level of the second polar electrode based on a change in relative capacitance between the first capacitor and the second capacitor based on the charge at the third connection.

16. The system of claim 13, further comprising a fourth connection to a third polar electrode of a third capacitor, the third polar electrode included in the electrode assembly, wherein:
the second connection is further configured to:
    route the excitation signal to the second polar electrode of the second capacitor when the liquid of the container is to be checked for proximity to the second polar electrode; and
    route a ground signal to the second polar electrode of the second capacitor when the liquid of the container is to be checked for proximity to the third polar electrode; and
the fourth connection is configured to:
    route the excitation signal to the third polar electrode of the third capacitor when the liquid of the container is to be checked for proximity to the third polar electrode; and
    route a ground signal to the third polar electrode of the third capacitor when the liquid of the container is to be checked for proximity to the second polar electrode.

17. The system of claim 16, wherein the sense electrode is further configured to form the third capacitor with the third polar electrode.

18. The system of claim 16, wherein the first polar electrode is coupled to the container outside of a possible range of the liquid.

* * * * *